(12) United States Patent
Kling et al.

(10) Patent No.: US 6,259,620 B1
(45) Date of Patent: Jul. 10, 2001

(54) MULTIPLE ENTRY MATCHING IN A CONTENT ADDRESSABLE MEMORY

(75) Inventors: Lars-Örjan Kling, Södertälje; Håkan O. Ahl, Stockholm; Kjell G. Torkelsson, Skarpnäck, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/666,844

(22) Filed: Sep. 21, 2000

Related U.S. Application Data
(60) Provisional application No. 60/187,895, filed on Mar. 8, 2000.

(51) Int. Cl.[7] .................................................. G11C 15/00
(52) U.S. Cl. ........................................ 365/49; 365/189.07
(58) Field of Search ................................ 365/49, 189.07, 365/189.08

(56) References Cited

U.S. PATENT DOCUMENTS

| | | |
|---|---|---|
| 5,226,005 | 7/1993 | Lee et al. . |
| 5,339,268 | 8/1994 | Machida . |
| 5,345,411 | 9/1994 | Yoneda . |
| 5,446,686 | 8/1995 | Bosnyak et al. . |
| 5,454,094 | 9/1995 | Montove . |
| 5,491,703 | 2/1996 | Barnaby et al. . |
| 5,568,416 | 10/1996 | Kawana et al. . |
| 5,787,458 | 7/1998 | Miwa . |
| 5,796,758 | 8/1998 | Levitan . |
| 5,835,928 | 11/1998 | Auslander et al. . |
| 5,890,201 | 3/1999 | McLellan et al. . |
| 5,999,435 | 12/1999 | Henderson et al. . |
| 6,000,008 | 12/1999 | Simcoe . |
| 6,081,440 | * 6/2000 | Washburn et al. ..................... 365/49 |
| 6,108,227 | * 8/2000 | Voelkel ................................. 365/49 |

* cited by examiner

Primary Examiner—David Nelms
Assistant Examiner—Thong Le
(74) Attorney, Agent, or Firm—Burns, Doane, Swecker & Mathis, L.L.P.

(57) ABSTRACT

A content addressable memory (CAM) permits a matching operation to be performed over multiple stored entries. The CAM includes a matrix of cells having (n+1) columns and m rows, wherein n and m are each integers greater than or equal to 1, and wherein each row of cells comprises: n data storage cells; a carry storage cell; word compare logic; and carry write logic. For each word of CAM storage, the data storage cells store bits representing one of a number of fractional parts of the data to be stored. The carry storage cell stores a signal that represents whether a previous row generated a match in a preceding matching operation. By presenting fractional parts of a large comparand in sequence, a final compare operation generates an output that indicates whether the entire comparand (i.e., the fractional parts of the comparand considered together) matched a stored entry in the CAM.

14 Claims, 4 Drawing Sheets

MULTIPLE ENTRY MATCHING IN A CONTENT ADDRESSABLE MEMORY

This application claim benefit to Provisional application 60/187,895 filed Mar. 8, 2000.

BACKGROUND

The present invention relates to computer memory devices, and more particularly to content addressable memories.

Figure 1:
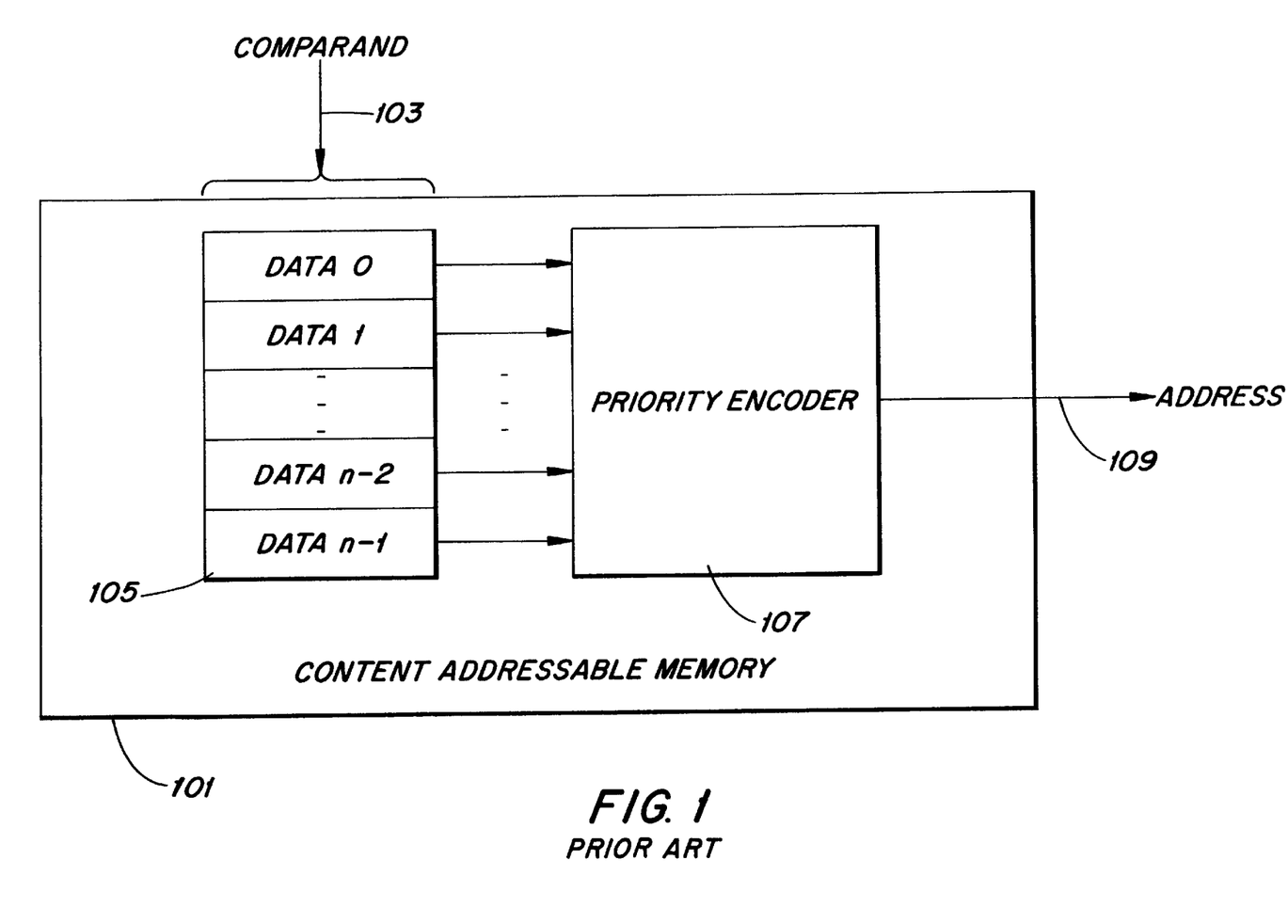
FIG. 1 is a block diagram of a conventional content addressable memory.

A conventional Content Addressable Memory (CAM) 101 is illustrated in FIG. 1. A CAM 101 can be viewed as a computer accessible storage device having an inverse type of access compared with typical addressable memories. For example, a typical Random Access Memory (RAM) is accessed by means of an address port. One supplies an address to the address port, and the RAM supplies at its output the data value that is stored at the memory location designated by the address. By contrast, one accesses a CAM 101 by supplying data of interest (referred to as a "comparand") at a comparand input port 103. The comparand is represented as a ternary value for each bit: "0", "1" or "*", the last one interpreted as a wild card. Each storage entry 105 in the CAM 101 includes, or is otherwise associated with, logic that compares the value stored in the entry 105 with the comparand. (Any value is considered to match a value of "*".) The resulting signals, each indicating whether a match occurred, are supplied to a priority encoder 107, which generates an address 109 that indicates one of the matching entries (e.g., the lowest address associated with a matching entry 105).

CAMs are increasingly used to implement massively parallel searches over a large number of data. For example, in the Internet Protocol (IP), the forwarding and classification of packets each require a search of a large to massive data base. IP forwarding lookup is the problem of using the destination address of an incoming packet to find a matching one from among tens of thousands of routing table entries. Once a best matching entry is found, it is used to determine the next hop for the packet. The routing table may contain several matching entries, where the one with the least number of "wild cards" is considered the best match.

IP classification is the more general problem of using selected parts of the IP and higher level headers of an incoming packet to find a matching one from among a hundred to a thousand classification entries. Once a highest priority entry is found, it is used for different purposes, such as filtering, IP security selection and virtual routing.

The IP forwarding lookup problem can be addressed by extending the basic CAM principle to allow the bits of stored data entries to take on wild card values. CAMs extended in this manner are called ternary CAMs. With such an extended CAM, the routing table entries are stored directly in the CAM, one after another. The destination address of the packet is simply presented as a comparand (without wild cards) to the CAM, which performs the matching in a single access. The address generated by the CAM is used to read further (non-associative) routing data from a standard RAM.

The task of updating the CAM is simple, since each data directly corresponds to a routing entry. The only consideration is that entries should be stored in order based on the number of wild cards. Hence, relocation can be necessary when updates are made.

The IP classification problem is improved, but not fully addressed by conventional CAMs. Considering all possible matching strategies, for the moment, it is apparent that the trivial method of matching against every table entry by reading them one after another will not achieve performance requirements. Hence, several methods using tree representations have been used. More particularly, the routing table may be compiled into a tree, which is stored in a RAM. The tree is traversed from the root to the leaves. In every node, a subfield of the destination address is used together with node specific data to decide what branch of the tree to select as the next step. The routing entries are associated with some nodes or leaves in the tree. Eventually, a best match will be found.

The problem with these methods is that, depending on implementation choices, they either require a large number of cycles to traverse the tree or alternatively are a huge waste of memory (several magnitudes more than needed for the entries). This problem is particularly acute with respect to the classification problem because the matching criteria are quite general and the number of bits to match very high. One possible solution is to split the problem into a multidimensional search problem, with each or a number of fields in the headers representing one dimension. Multiple simpler searches are then performed in each dimension and the results are combined in some way in a second step. However, different classification entries will overlap each other when projected to a dimension, generating extra complexity to both steps of the problem.

Applying a conventional CAM to the Ip classification problem simplifies the search in each of the dimensions. However, the use of conventional CAMs does not provide a straightforward solution to combining the results in the above-described second step of the multidimensional matching problem.

Like ordinary memories, a conventional CAM is arranged as number of entries, each holding a data word of a fixed width. Matching is limited to this width. Conventional CAMs offer no general and fast way to make matches to a comparand greater than the width of a cell.

SUMMARY

In accordance with one aspect of the present invention, the foregoing and other objects are achieved in a content addressable memory that comprises a matrix of cells having (n+1) columns and m rows, wherein n and m are each integers greater than or equal to 1, and wherein each row of cells comprises: n data storage cells, a carry storage cell, word compare logic, and carry write logic.

Each of the n data storage cells comprises: storage logic for storing a respective one of n data signals; an input for receiving a respective one of n comparand data signals; and bit compare logic that generates a bit compare signal that indicates whether the stored one of the n data signals matches the received one of the n comparand data signals.

The carry storage cell comprises: a first input for receiving a carry data signal; storage logic for storing the carry data signal; a second input for receiving a carry comparand data signal; and carry compare logic that generates a carry compare signal that indicates whether the stored carry data signal matches the received carry comparand data signal.

The word compare logic generates a word compare signal that indicates whether each of the bit compare signals in the row indicates that the stored one of the n data signals matches the received one of the n comparand data signals and that the carry compare signal in the row indicates that the stored carry data signal matches the received carry comparand data signal.

The carry write logic generates a carry storage cell write signal only if the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal.

In another aspect of the invention, each of the n comparand data signals and the carry comparand data signals may be a ternary value selected from a group of values consisting of "0", "1" and "don't care"; and the "don't care" value matches any of the ternary values.

In yet another aspect of the invention, the carry write logic further comprises a write input port for receiving a carry write signal, and the carry write logic generates the carry storage cell write signal only if the carry write signal is asserted and the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal.

In still another aspect of the invention, the word compare logic comprises the bit compare signals in the row being "wire ANDed" together.

In another aspect of the invention, techniques and apparatuses for operating the inventive content addressable memory is provided. The operating techniques include: storing one or more data items in the content addressable memory, wherein each data item comprises a plurality of fractional parts that are distinguishable from one another, and wherein for each data item, the fractional parts are stored in different rows of the content addressable memory; clearing the stored carry data signal in each of the rows; and sequentially supplying fractional parts of a comparand data item to the inputs to the n data storage cells and to the second inputs of the carry storage cells, wherein a first one of the fractional parts of the comparand data item comprises a carry part that is not set equal to a "1" value; and remaining ones of the fractional parts of the comparand data item each comprise a carry part that is set equal to a "1" value, whereby assertion of one of the word compare signals indicates that all of the fractional parts of a stored data item matched the respective supplied fractional parts of the comparand data item.

In practicing some embodiments of this aspect of the invention, the fractional parts are stored in successive rows of the content addressable memory.

In yet another aspect of the invention, each fractional part of the comparand data item may comprise: a comparand data fraction part; a comparand tag part; and a carry part. The comparand tag part may be useful, for example, for specifying what position the fractional part occupies in the sequence of fractional parts that make up the comparand data item. By setting values of the comparand tag parts such that for each fractional part of the comparand data item, the comparand tag part is set to a value that distinguishes the fractional part from other fractional parts of the comparand data item, the user is able to ensure that matching occurs only when the same sequence of fractional parts is found in the content addressable memory.

BRIEF DESCRIPTION OF THE DRAWINGS

The objects and advantages of the invention will be understood by reading the following detailed description in conjunction with the drawings in which.

DETAILED DESCRIPTION

The various features of the invention will now be described with respect to the figures, in which like parts are identified with the same reference characters.

The invention relates to methods and devices for matching over multiple entries in a CAM. In accordance with an aspect of the invention, this is achieved by providing special carry-cell logic in the memory. The carry-cell logic permits each cell to generate a match based not only on whether that cell's contents match a presently applied comparand, but also whether a neighboring cell matched a previously applied comparand.

These and other aspects of the invention will now be described in greater detail in connection with a number of exemplary embodiments. To facilitate an understanding of the invention, a number of aspects of the invention are described in terms of sequences of actions to be performed by elements of specialized hardware or of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable storage medium having stored therein signals representing an appropriate set of computer instructions that would cause a processor to carry out the techniques described herein. Computer readable storage media include, but are not limited to, static or dynamic Random Access Memory (SRAM or DRAM), Read Only Memory (ROM), magnetic storage media (e.g., disk, diskettes or tape) and optical media (e.g., Compact Disk ROM, or CD ROM). Thus, the various aspects of the invention may be embodied in many different forms, and all such forms are contemplated to be within the scope of the invention. For each of the various aspects of the invention, any such form of embodiment may be referred to herein as "logic that" performs a described action.

Figure 2:
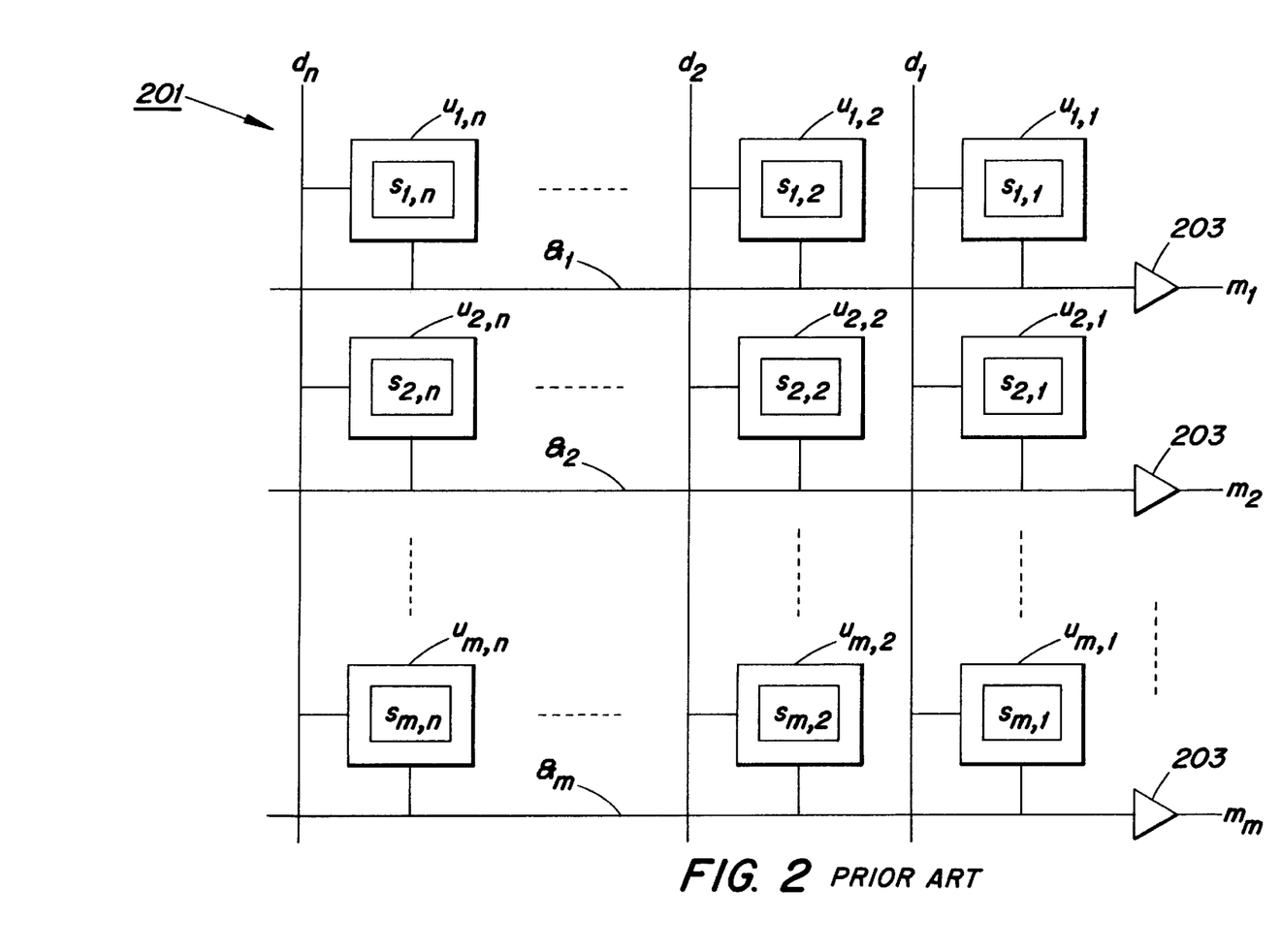
FIG. 2 is a block diagram of a memory matrix of a conventional CAM.

Referring to FIG. 2, this is a block diagram of a memory matrix 201 of a conventional CAM 101. The CAM 101 is organized as m entries, each holding a word of n bits. Each CAM cell $u_{i,j}$ stores one data bit $s_{i,j}$ of a word i. The n vertical data lines $d_j$ hold the comparand input data during a match. The m horizontal "wired AND" lines, $\&_i$, compute the result of a match. This result is amplified by amplifiers 203 and presented as an output to the priority encoder (not shown in FIG. 2) on m matching signals $m_i$. The logic for writing data into the cells is well known and not relevant to the invention. Thus, for the sake of simplicity, the data writing logic has been omitted from the figure.

Conventional CAMs can also do partial matches. In that more general case, both the comparand data and the stored data are ternary values $\{0,1,*\}$, where "*" represents a "don't care" state that matches anything. In practice, the n horizontal data lines are usually implemented as double physical lines where the ternary values are coded as a pair of binary values. The actual coding is not important to the invention, however, so in this description the abstraction of single data lines carrying ternary values is maintained.

The function of the cells and the result computation logic is defined in a functional notation as follows:

Cell $u_{i,j}$:
    $\&_{i,j}$=if ($s_{i,j} \approx d_j$) then 1 else 0

Result logic$_i$:
    $\&_i$=if ($\forall j \&_{i,j}$=1) then 1 else 0
    $m_i = \&_i$ where the matching operator, $\approx$, is given by:
    ($x \approx y$)=if ($x=y$ or $x=*$ or $y=*$) then "true" else "false"

Figure 3:
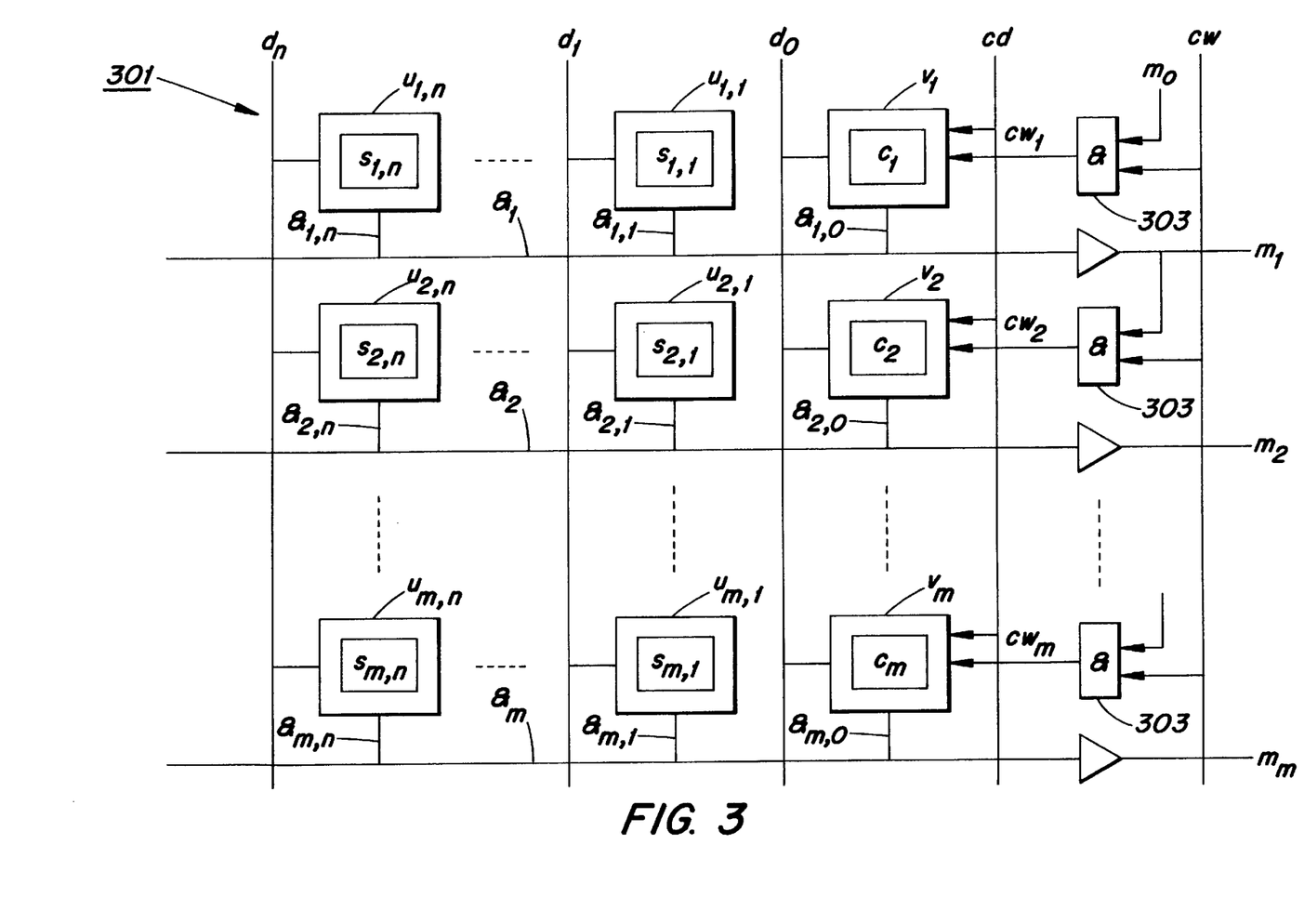
FIG. 3 is a block diagram of a memory matrix that has been extended in accordance with an aspect of the invention.

FIG. 3 is a block diagram of a similar memory matrix 301 that has been extended in accordance with an aspect of the invention. In addition to the cells $u_{i,j}$ described above, a special CAM carry cell $v_i$ is introduced for every word i. Each of the CAM carry cells $v_i$ stores a carry data bit, $C_i$, that mirrors the result of a previous match result for the previous word i−1 (e.g., in the exemplary embodiment the previous word is the word immediately above the present word under consideration).

The CAM carry cell $v_i$ participates as an ordinary cell during a matching operation. For this purpose, word compare logic $\&_i$ is provided that generates a word compare signal $m_i$ that indicates whether each of the bit compare signals in the row indicates that the stored one of the n data signals $s_{i,j}$ matches the received one of the n comparand data signals $d_j$ and that the carry compare signal in the row indicates that the stored carry data signal $c_i$ matches the received carry comparand data signal $d_0$ The CAM carry cell $v_i$ may also be written as a result of the matching operation. A vertical carry data line, cd, holds the value to be optionally written, and a vertical carry write line, cw, must be asserted in order for the CAM carry cells $v_i$ to be conditionally written. The phrase "conditionally written" has been used in the preceding sentence because the cw line does not, by itself, determine whether the value on the cd line will be clocked into a CAM carry cell $v_i$. Rather, for each of the CAM carry cells, $v_i$, carry write logic 303 is provided that generates a carry write signal $cw_i$ that enables the carry write operation to be performed if and only if the carry write line, cw, is active and there is a match for the immediately preceding word, i−1 (the latter condition being indicated by the assertion of the matching signal, $m_{i−1}$). In the exemplary embodiment, the carry write logic 303 is implemented as a logical AND gate. However, in alternative embodiments, equivalent logic configurations could instead be used.

The function of the cells $u_{i,j}$ and $v_i$ and the result computation logic for the exemplary embodiment of the invention is given by the following:

Cell $u_{i,j}$:
    $\&_{i,j}$=if ($s_{i,j} \approx d_j$) then 1 else 0, for j∈{1 . . . n}

Carry Cell $v_i$:
    $\&_{i,0}$=if ($c_i \approx d_0$) then 1 else 0
    $c_i'$=if (cw=1 and $m_{i−1}$=1) then cd else $c_i$ Result logic$_i$:
    $\&_i$=if ($\forall j \&_{i,j}$=1) then 1 else 0
    $m_i = \&_i$ where the matching operator, $\approx$, is again given by:
    ($x \approx y$)=if ($x=y$ or $x=*$ or $y=*$) then "true" else "false",
and where the notation $c_i'$ denotes the value of $c_i$ in the next clock cycle.

Note that $m_o$ has been introduced as a new input to the cell matrix. The value of $m_0$ is 0 unless otherwise noted. Further, one more horizontal data line, $d_0$, has been introduced as a new input to the cell matrix for carrying the comparand value that is supplied to each of the CAM carry cells $v_i$.

The exemplary device described above with respect to FIG. 3 can be used for matching over multiple entries. An exemplary technique for doing this will now be described with reference to FIG. 4. A stored data item occupying more than a single entry is partitioned into q smaller fractions denoted by $S_1$ to $S_q$. A unique tag value, t, ranging from 1 to q is introduced for each type of fraction. Each entry in the CAM holds a data fraction appended by its corresponding tag value. Fractions belonging to the same original data are stored in successive entries (e.g., immediately following one another) and in the internal order of their corresponding tag values. The fractions and their corresponding tags are stored in the conventional CAM cells, $u_{i,n}$ . . . $u_{i,1}$. A sufficient number of the conventional CAM cells should be allocated to the tag bits to permit representing the highest tag value, q. The remaining conventional CAM cells for each word may be allocated to storing one of the fractions. The CAM carry cell, $v_i$, initially stores an unknown value, depicted in FIG. 4 by the "?" symbol.

Figure 4:
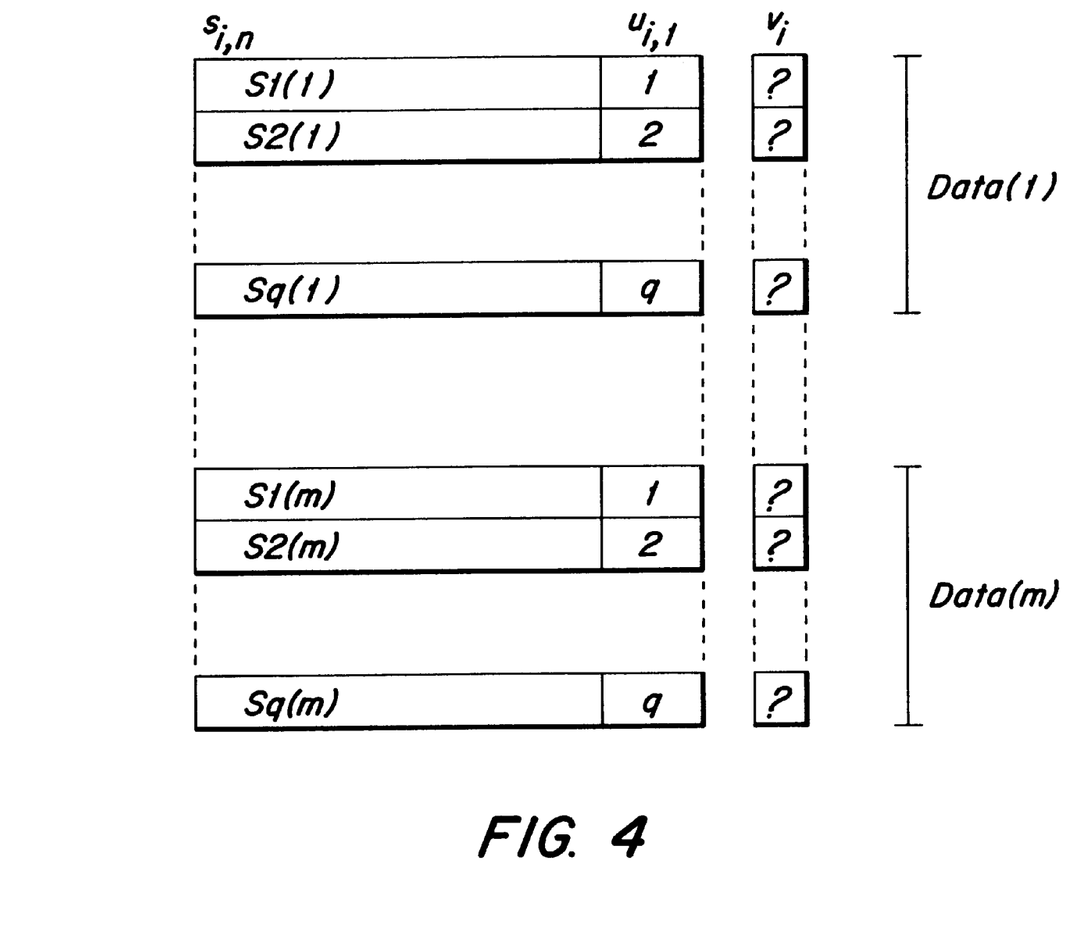
FIG. 4 is an exemplary technique for using the inventive CAM to perform a matching operation over multiple entries.

The comparand value is similarly partitioned into corresponding fractions, denoted herein by $D_1$ to $D_q$. For each of the comparand fractions $D_1$ to $D_q$, some of the bits represent fractional data to be matched, other bits represent tag bits to be matched, and another bit represents a carry bit to be matched. The purpose of the tag bits is to enable the marking of a fractional part as being associated with a particular position (e.g., first, second, third, . . . ) within the complete stored data item, so that when a matching operation is to be performed, a comparand value can specify not only the desired fractional data part, but also the tag value to indicate which fractional part is being searched.

The algorithm for matching over the multiple fractions may be specified as follows (where text to the right of the "/*" indicates a comment):

Let D denote the bit vector formed by $d_n$ . . . $d_0$ and
Let <x,y,z> be the partitioning of that vector into:
    x=the comparand data fraction part, $d_d$ . . . $d_{t+1}$;
    y=the comparand tag part, $d_t$ . . . $d_1$; and
    z=the carry part, $d_0$,
    where t is the number of bits in the tag.
Do
Cycle 0: d=<*,*,*>, cd=0, cw=1, $m_0$=1/* clear all carry bits
Cycle 1: d=<$D_1$,1,*>, cd=1, cw=1
Cycles 2 through q:
For p=2 to q do
    Cycle p: D=<$D_p$,p,1>, cd=1, cw=1 /* match data,
    /* tag, and previous matches In cycle 0, the comparand data is "don't care", which means that every entry matches. As a result, all carry cells will be initialized with a 0 value.

In cycle 1, the first fraction of the comparand appended by a tag value of 1 and a "don't care" value on the carry part is presented on the comparand data lines. All entries that have a first data fraction matching the first comparand data will match. The result is that for each such entry, the carry cell of the next entry, holding the second data fraction, will be written with a "1" value.

In cycle 2, the first fraction of the comparand appended by a tag value of 2 and a carry value of 1 is presented on the comparand data lines. All entries that have a second data fraction matching the second comparand data, and for which the previous entry had a match in the previous cycle will match. The result is that for each such entry, the carry cell of the next entry, holding the third data fraction, will be written with a "1" value.

The same type of operation will be performed for all remaining fractions. The result in every cycle is that the carry bit in the next cycle will be written if there were matches for all previous fractions. Hence, in the last cycle, there will only be a match at an entry if all fractions belonging to the same original stored data match the corresponding fractions of the comparand data in the proper order.

Consequently, at the end of the last cycle, a priority encoder such as the priority encoder 107 shown in FIG. 1 will present the address of the last fraction of a complete stored data that matches a complete operand.

The invention is useful for storing and matching against arbitrarily long data in a CAM. For some special cases, other specific methods using repeated accesses to the CAM can be used to match long data. However, the latency is much higher and the memory consumption is often higher.

The invention can be used in all technical areas containing a time critical non-trivial matching problem. One example is the IP classification problem present in Internet routers, as described in the BACKGROUND section. To apply the inventive CAM to solve such a problem, different relevant fields of the classification entries are stored at consecutive addresses of the CAM. The inventive CAM allows logical "AND" conditions to be performed between consecutive entries over several cycles, hence allowing for matching on arbitrarily long data. The result is immediately available as an address after the last cycle without any combination of results needed.

In other aspects of the invention, data fractions, other than the first and the last one, can be omitted where all bits have "don't care" as a value.

In yet other another aspect of the invention, the tag values do not need to be the ones indicated above in the exemplary embodiment. Instead, any values will do as long as the order between different types of fractions is kept. Put another way, for each fractional part of the comparand data item, the comparand tag part may be set to any value that distinguishes the fractional part from other fractional parts of the comparand data item. In the matching algorithm, this means that the constants 1 to q used for the tag can be replaced by distinguishable variables $T_1$ to $T_q$.

This flexibility in specifying tag values permits the inventive CAM to be applied to efficiently solve the problem of matching a plurality of different comparand data items, wherein each of the comparand data items has a common portion and a non-common portion. The common portion is the same for all of the comparand data items, whereas the non-common portion of a comparand data item is different from the non-common portions of the other data items. This is useful in the IP classification problem present in Internet routers, as described in the BACKGROUND section. For example, assume that it is desired to perform three classifications, designated R, S and T, and that A, B, C, D, E, F and G are different parameters to match for. Now assume that:

R should match on A, B, C, D;
S should match on A, B, C, E; and
T should match on A, B, F, G.

Of course, one could perform these classifications sequentially, each time sequencing through all four parameters. However, the structure of the inventive CAM permits the classifications to be performed more efficiently, by presenting the parameters (together with their respective tags) as comparand data items to the CAM in the following order:

Reset cycle (clears all carry bits)
comparand data item=A
comparand data item=B
comparand data item=C
comparand data item=D and use result to lookup result of R
comparand data item=E and use result to lookup result of S
comparand data item=F
comparand data item=G and use result to lookup result of T.

It will be observed that the above strategy is effective, in part, because after their initial resetting, at no point in the process are carry bits subsequently reset. Consequently, once a carry bit indicates that the sequence A, B, C has been found, it remains set, thus permitting comparand data items D and E to be individually tested. Similarly, the carry bit that indicates that the sequence A, B has been located remains set, thus permitting the later testing for the remaining parameters F and G.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, it will be readily apparent to those of ordinary skill in the art that, while an exemplary embodiment of the invention has been described in terms of "rows" and "columns" of a matrix of cells, alternative embodiments can be derived by interchanging the functions of rows and columns. Consequently, as used throughout this description as well as in the claims, the terms "rows" and "columns" shall be construed to more generally mean respective first and second orthogonal directions.

Similarly, the exemplary embodiment illustrates data being stored into consecutive rows in a top-to-bottom direction. However, alternative embodiments of the invention can just as easily be arranged to function in other directions, such as from bottom-to-top. Consequently, throughout this description as well as in the claims, the use of terms such as "previous", "next" and the like shall not be construed to refer only to the directions illustrated in the exemplary embodiment, but shall instead more generally refer to that which would be "previous" or "next" (etc.) as determined relative to a predetermined orientation, regardless of whether that predetermined orientation is top-to-bottom, bottom-to-top, or other.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A content addressable memory, comprising:
   a matrix of cells having (n+1) columns and m rows, wherein n and m are each integers greater than or equal to 1, and wherein each row of cells comprises:
   n data storage cells, each comprising:
      storage logic for storing a respective one of n data signals;
      an input for receiving a respective one of n comparand data signals; and
      bit compare logic that generates a bit compare signal that indicates whether the stored one of the n data signals matches the received one of the n comparand data signals;

a carry storage cell comprising:
   a first input for receiving a carry data signal;
   storage logic for storing the carry data signal;
   a second input for receiving a carry comparand data signal; and
   carry compare logic that generates a carry compare signal that indicates whether the stored carry data signal matches the received carry comparand data signal;

word compare logic that generates a word compare signal that indicates whether each of the bit compare signals in the row indicates that the stored one of the n data signals matches the received one of the n comparand data signals and that the carry compare signal in the row indicates that the stored carry data signal matches the received carry comparand data signal; and carry write logic that generates a carry storage cell write signal only if the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal.

2. The content addressable memory of claim 1, wherein:
each of the n comparand data signals and the carry comparand data signals is a ternary value selected from a group of values consisting of "0", "1" and "don't care"; and
the "don't care" value matches any of the ternary values.

3. The content addressable memory of claim 1, wherein the carry write logic further comprises a write input port for receiving a carry write signal,
and wherein the carry write logic generates the carry storage cell write signal only if the carry write signal is asserted and the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal.

4. The content addressable memory of claim 1, wherein the word compare logic comprises the bit compare signals in the row being "wire ANDed" together.

5. A method of operating a content addressable memory that comprises
a matrix of cells having (n+1) columns and m rows, wherein n and m are each integers greater than or equal to 1, and wherein each row of cells comprises:
   n data storage cells, each comprising:
      storage logic for storing a respective one of n data signals;
      an input for receiving a respective one of n comparand data signals; and
      bit compare logic that generates a bit compare signal that indicates whether the stored one of the n data signals matches the received one of the n comparand data signals;
   a carry storage cell comprising:
      a first input for receiving a carry data signal;
      storage logic for storing the carry data signal;
      a second input for receiving a carry comparand data signal; and
      carry compare logic that generates a carry compare signal that indicates whether the stored carry data signal matches the received carry comparand data signal;
   word compare logic that generates a word compare signal that indicates whether each of the bit compare signals in the row indicates that the stored one of the n data signals matches the received one of the n comparand data signals and that the carry compare signal in the row indicates that the stored carry data signal matches the received carry comparand data signal; and
   carry write logic that generates a carry storage cell write signal only if the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal, wherein the method comprises:

storing one or more data items in the content addressable memory, wherein each data item comprises a plurality of fractional parts that are distinguishable from one another, and wherein for each data item, the fractional parts are stored in different rows of the content addressable memory;

clearing the stored carry data signal in each of the rows; and sequentially supplying fractional parts of a comparand data item to the inputs to the n data storage cells and to the second inputs of the carry storage cells, wherein:

a first one of the fractional parts of the comparand data item comprises a carry part that is not set equal to a "1" value; and remaining ones of the fractional parts of the comparand data item each comprise a carry part that is set equal to a "1" value, whereby assertion of one of the word compare signals indicates that all of the fractional parts of a stored data item matched the respective supplied fractional parts of the comparand data item.

6. The method of claim 5, wherein the fractional parts are stored in successive rows of the content addressable memory.

7. The method of claim 5, wherein each fractional part of the comparand data item comprises:
   a comparand data fraction part;
   a comparand tag part; and
   a carry part.

8. The method of claim 7, wherein, for each fractional part of the comparand data item, the comparand tag part is set to a value that distinguishes the fractional part from other fractional part s of the comparand data item.

9. An apparatus for operating a content addressable memory that comprises
a matrix of cells having (n+1) columns and m rows, wherein n and m are each integers greater than or equal to 1, and wherein each row of cells comprises:

n data storage cells, each comprising:
    storage logic for storing a respective one of n data signals;
    an input for receiving a respective one of n comparand data signals; and
    bit compare logic that generates a bit compare signal that indicates whether the stored one of the n data signals matches the received one of the n comparand data signals;
a carry storage cell comprising:
    a first input for receiving a carry data signal;
    storage logic for storing the carry data signal;
    second input for receiving a carry comparand data signal; and
    carry compare logic that generates a carry compare signal that indicates whether the stored carry data signal matches the received carry comparand data signal;
word compare logic that generates a word compare signal that indicates whether each of the bit compare signals in the row indicates that the stored one of the n data signals matches the received one of the n comparand data signals and that the carry compare signal in the row indicates that the stored carry data signal matches the received carry comparand data signal; and
carry write logic that generates a carry storage cell write signal only if the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal,
wherein the apparatus comprises:
logic that stores one or more data items in the content addressable memory, wherein each data item comprises a plurality of fractional parts that are distinguishable from one another, and wherein for each data item, the fractional parts are stored in different rows of the content addressable memory;
logic that clears the stored carry data signal in each of the rows; and
logic that sequentially supplies fractional parts of a comparand data item to the inputs to the n data storage cells and to the second inputs of the carry storage cells,
wherein:
a first one of the fractional parts of the comparand data item comprises a carry part that is not set equal to a "1" value; and
remaining ones of the fractional parts of the comparand data item each comprise a carry part that is set equal to a "1" value,
whereby assertion of one of the word compare signals indicates that all of the fractional parts of a stored data item matched the respective supplied fractional parts of the comparand data item.

10. The apparatus of claim 9, wherein the fractional parts are stored in successive rows of the content addressable memory.

11. The apparatus of claim 9, wherein each fractional part of the comparand data item comprises:
    a comparand data fraction part;
    a comparand tag part; and
    a carry part.

12. The apparatus of claim 11, wherein, for each fractional part of the comparand data item, the comparand tag part is set to a value that distinguishes the fractional part from other fractional parts of the comparand data item.

13. A method of operating a content addressable memory that comprises
    a matrix of cells having (n+1) columns and m rows, wherein n and m are each integers greater than or equal to 1, and wherein each row of cells comprises:
        n data storage cells, each comprising:
            storage logic for storing a respective one of n data signals;
            an input for receiving a respective one of n comparand data signals; and
            bit compare logic that generates a bit compare signal that indicates whether the stored one of the n data signals matches the received one of the n comparand data signals;
        a carry storage cell comprising:
            a first input for receiving a carry data signal;
            storage logic for storing the carry data signal;
            a second input for receiving a carry comparand data signal; and
            carry compare logic that generates a carry compare signal that indicates whether the stored carry data signal matches the received carry comparand data signal;
        word compare logic that generates a word compare signal that indicates whether each of the bit compare signals in the row indicates that the stored one of the n data signals matches the received one of the n comparand data signals and that the carry compare signal in the row indicates that the stored carry data signal matches the received carry comparand data signal; and
        carry write logic that generates a carry storage cell write signal only if the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal,
    wherein the method comprises:
    storing one or more data items in the content addressable memory, wherein each data item comprises a plurality of fractional parts that are distinguishable from one another, and wherein for each data item, the fractional parts are stored in different rows of the content addressable memory;
    clearing the stored carry data signal in each of the rows;
    sequentially supplying one or more common fractional parts and one or more first non-common fractional parts of a first comparand data item to the inputs to the n data storage cells and to the second inputs of the carry storage cells,
    wherein:
        a first one of the common fractional parts of the first comparand data item comprises a carry part that is not set equal to a "1" value;

remaining ones of the common fractional parts of the first comparand data item each comprise a carry part that is set equal to a "1" value; and the one or more first non-common fractional parts of the first comparand data item each comprise a carry part that is set equal to a "1" value, whereby assertion of one of the word compare signals indicates that all of the fractional parts of a stored data item matched the respective supplied common and first non-common fractional parts of the first comparand data item; and sequentially supplying one or more second non-common fractional parts of a second comparand data item to the inputs to the n data storage cells and to the second inputs of the carry storage cells, wherein the one or more second non-common fractional parts of the second comparand data item each comprise a carry part that is set equal to a "1" value, whereby assertion of one of the word compare signals indicates that all of the fractional parts of a stored data item matched the respective supplied common and second non-common fractional parts of the second comparand data item.

14. An apparatus for operating a content addressable memory that comprises a matrix of cells having (n+1) columns and m rows, wherein n and m are each integers greater than or equal to 1, and wherein each row of cells comprises:

n data storage cells, each comprising:
storage logic for storing a respective one of n data signals;
an input for receiving a respective one of n comparand data signals; and
bit compare logic that generates a bit compare signal that indicates whether the stored one of the n data signals matches the received one of the n comparand data signals;

a carry storage cell comprising:
a first input for receiving a carry data signal;
storage logic for storing the carry data signal;
a second input for receiving a carry comparand data signal; and
carry compare logic that generates a carry compare signal that indicates whether the stored carry data signal matches the received carry comparand data signal;

word compare logic that generates a word compare signal that indicates whether each of the bit compare signals in the row indicates that the stored one of the n data signals matches the received one of the n comparand data signals and that the carry compare signal in the row indicates that the stored carry data signal matches the received carry comparand data signal; and carry write logic that generates a carry storage cell write signal only if the word compare signal generated by the word compare logic in a previous row of cells indicates that each of the bit compare signals in the previous row indicates that the stored one of the n data signals matches the received one of the n comparand data signals and that the carry compare signal in the previous row indicates that the stored carry data signal matches the received carry comparand data signal, wherein the apparatus comprises:

logic that stores one or more data items in the content addressable memory, wherein each data item comprises a plurality of fractional parts that are distinguishable from one another, and wherein for each data item, the fractional parts are stored in different rows of the content addressable memory;

logic that clears the stored carry data signal in each of the rows;

logic that sequentially supplies one or more common fractional parts and one or more first non-common fractional parts of a first comparand data item to the inputs to the n data storage cells and to the second inputs of the carry storage cells, wherein:
a first one of the common fractional parts of the first comparand data item comprises a carry part that is not set equal to a "1" value;
remaining ones of the common fractional parts of the first comparand data item each comprise a carry part that is set equal to a "1" value; and
the one or more first non-common fractional parts of the first comparand data item each comprise a carry part that is set equal to a "1" value, whereby assertion of one of the word compare signals indicates that all of the fractional parts of a stored data item matched the respective supplied common and first non-common fractional parts of the first comparand data item; and logic that sequentially supplies one or more second non-common fractional parts of a second comparand data item to the inputs to the n data storage cells and to the second inputs of the carry storage cells, wherein the one or more second non-common fractional parts of the second comparand data item each comprise a carry part that is set equal to a "1" value, whereby assertion of one of the word compare signals indicates that all of the fractional parts of a stored data item matched the respective supplied common and second non-common fractional parts of the second comparand data item.

* * * * *